US011496065B2

(12) United States Patent
Aichriedler et al.

(10) Patent No.: US 11,496,065 B2
(45) **Date of Patent: *Nov. 8, 2022**

(54) CORELESS CURRENT SENSOR FOR HIGH CURRENT POWER MODULE

(71) Applicant: Infineon Technologies AG, Neubiberg (DE)

(72) Inventors: Leo Aichriedler, Puch (AT); Gerald Wriessnegger, Villach (AT)

(73) Assignee: Infineon Technologies AG, Neubiberg (DE)

( * ) Notice: Subject to any disclaimer, the term of this patent is extended or adjusted under 35 U.S.C. 154(b) by 8 days.

This patent is subject to a terminal disclaimer.

(21) Appl. No.: 17/308,466

(22) Filed: May 5, 2021

(65) Prior Publication Data

US 2021/0257925 A1 Aug. 19, 2021

Related U.S. Application Data

(63) Continuation of application No. 15/878,982, filed on Jan. 24, 2018, now Pat. No. 11,239,761.

(51) Int. Cl.

| | |
|---|---|
| ***H02M 7/00*** | (2006.01) |
| ***G01R 15/20*** | (2006.01) |
| ***H02K 11/27*** | (2016.01) |
| ***H02P 27/06*** | (2006.01) |
| ***H02K 11/33*** | (2016.01) |
| ***G01R 19/10*** | (2006.01) |

(52) U.S. Cl.

CPC .......... *H02M 7/003* (2013.01); *G01R 15/202* (2013.01); *G01R 15/207* (2013.01); *G01R 19/10* (2013.01); *H02K 11/27* (2016.01); *H02K 11/33* (2016.01); *H02P 27/06* (2013.01)

(58) Field of Classification Search

None

See application file for complete search history.

(56) References Cited

U.S. PATENT DOCUMENTS

2013/0214593 A1* 8/2013 Ohashi ................ G01R 15/207 307/10.1

FOREIGN PATENT DOCUMENTS

| | | | |
|---|---|---|---|
| JP | 2013013169 A | * | 1/2013 |
| JP | 2013013169 A | | 1/2013 |
| JP | 2013234990 A | | 11/2013 |
| JP | 2015137894 A | | 7/2015 |
| JP | 2016121960 A | | 7/2016 |
| KR | 20010016949 A | | 3/2001 |

(Continued)

*Primary Examiner* — Muhammad S Islam
*Assistant Examiner* — Bradley R Brown
(74) *Attorney, Agent, or Firm* — Harrity & Harrity, LLP

(57) ABSTRACT

A power module is provided that is configured to supply power to a load. The power module includes a current generator configured to generate a current; a current rail configured to receive the current and output the current from the power module, wherein the current rail includes a first opening formed therethrough, and the current, while flowing along the current rail in an output direction, flows around the first opening; and a housing that houses the current generator, wherein the housing includes an outer frame from which the current rail outwardly extends, wherein the outer frame includes a recess aligned with the first opening of the current rail such that the recess and the first opening form a unitary opening.

19 Claims, 5 Drawing Sheets

200 22 30 30 30 29 25u 25v 29 25w 24u 24v 29 20 24w 31 27

(56) References Cited

FOREIGN PATENT DOCUMENTS

| | | | |
|---|---|---|---|
| KR | 20100029390 | A | 3/2010 |
| KR | 20150003309 | U | 9/2015 |
| WO | 2013031291 | A1 | 3/2013 |
| WO | 2015115472 | A1 | 8/2015 |

* cited by examiner 31
24
29
34
32
25
33

34
33a
29
24
25
32
33b 24
33a
29
24
32
33b
sensing elements position

400
Power
Module
1
4u
Current Sensor
Module
5u
4v
5v
43u
43v
2
5w
43w
4w
Iu
Iv
Iw
Inverter Control Board
3
In-situ Sensor
Programming Tool
41
End-of-Line Test System
42

500
50
29
25u
29
25v
29
25w
24u
24v
24w

CORELESS CURRENT SENSOR FOR HIGH CURRENT POWER MODULE

CROSS-REFERENCE TO RELATED APPLICATIONS

This application is a continuation of U.S. patent application Ser. No. 15/878,982 filed Jan. 24, 2018, which is incorporated by reference as if fully set forth.

FIELD

The present disclosure relates generally to current power modules, and, more particularly, to a coreless current sensor for current power modules.

BACKGROUND

For high power drive implementations, in-phase current sensors are used to determine the phase currents delivered by an inverter power module to an electric motor. Implementing in-phase current sensing is challenging due to the high power environment which may include phase currents up to 1 kA, voltages up to 1200V, step voltage transients up to 15 kV/μs (Si) or 120 kV/μs (SiC), voltage overshoots of more than 100V in both directions (below DCLink− and DCLink+), a requirement of safe isolation (minimum basic), and a power density (output power per volume). Magnetic sensors implementing field concentrator according to a core-based sensing principle may be used for such in-phase current sensors.

Using core-based solution, a field concentrator (e.g., iron core wrapped around a current rail) is placed around each current rail. The field concentrator concentrates a magnetic field produced by a current flowing through the respective current rail, onto a magnetic sensor (monocell) such that a measurement is made.

However, using a core-based magnetic sensor has a number of disadvantages, including: cost, complex assembly strategy, inefficiencies in power dissipation, accuracy from hysteresis effects, non-linearity of the field concentrator, and saturation effects, overload capability (remanence), weight, and size. For example, to assemble, each current rail of a power module needs to be routed through a field concentrator associated with each magnetic sensor. This adds complexity and bulk to the assembly of the power module.

Therefore, a power module with an improved current sensor may be desirable.

SUMMARY

According to one or more embodiments, a power module is provided that is configured to supply power to a load. The power module includes a current generator, a current rail, and a magnetic sensor. The current generator is configured to generate a current. The current rail is configured to receive the current and output the current from the power module. The current rail includes a first opening formed therethrough, and the current, while flowing along the current rail in an output direction, produces a magnetic field. The magnetic sensor is disposed in the first opening of the current rail, and is configured to generate a differential sensor signal based on the magnetic field impinging thereon. The current generator is further configured to regulate the current based on the differential sensor signal.

One or more embodiments further provide a multi-phase current power module. The power module is configured to supply power to a load, and includes a current generator, a plurality of current rails, and a plurality of magnetic sensors. The current generator is configured to generate a plurality of phase currents. The plurality of current rails are each configured to receive a respective phase current of the plurality of phase currents and output the respective phase current from the power module. Each of the plurality of current rails includes a first opening formed therethrough, and the plurality of phase currents, while flowing along a respective current rail of the plurality of current rails in an output direction, produces a respective magnetic field. Each one of the plurality of magnetic sensors is disposed in the first opening of a different one of the plurality of current rails. Each magnetic sensor is configured to generate a differential sensor signal based on the respective magnetic field impinging thereon such that a plurality of differential sensor signals are generated. The current generator is further configured to regulate the plurality of phase currents based on the plurality of differential sensor signals received from the plurality of magnetic sensors.

BRIEF DESCRIPTION OF THE DRAWINGS

Embodiments are described herein making reference to the appended drawings.

DETAILED DESCRIPTION

Figure 1:
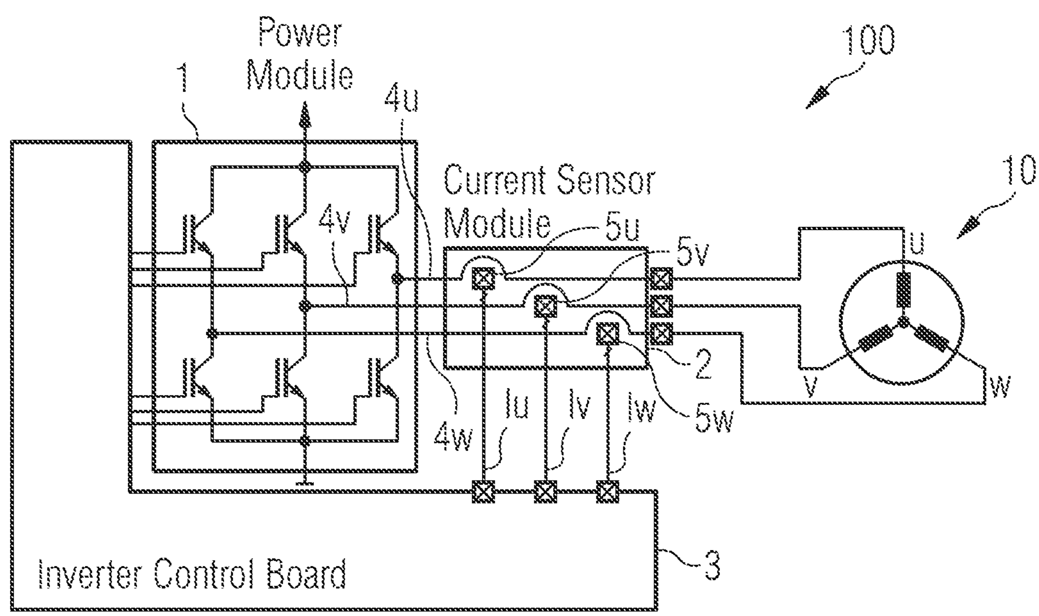
FIG. 1 is a schematic block diagram illustrating a motor control loop of a power module according to one or more embodiments.

In the following, details are set forth to provide a more thorough explanation of the exemplary embodiments. However, it will be apparent to those skilled in the art that embodiments may be practiced without these specific details In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

Embodiments relate to sensors and sensor systems, and to obtaining information about sensors and sensor systems. A sensor may refer to a component which converts a physical quantity to be measured to an electric signal, for example, a current signal or a voltage signal. The physical quantity may for example comprise a magnetic field, an electric field, a pressure, a force, a current or a voltage, but is not limited thereto. A sensor device, as described herein, may be a an angle sensor, a linear position sensor, a speed sensor, motion sensor, and the like.

A magnetic field sensor, for example, includes one or more magnetic field sensor elements that measure one or more characteristics of a magnetic field (e.g., an amount of magnetic field flux density, a field strength, a field angle, a field direction, a field orientation, etc.). The magnetic field may be produced by a magnet, a current-carrying conductor (e.g., a wire), the Earth, or other magnetic field source. Each magnetic field sensor element is configured to generate a sensor signal (e.g., a voltage signal) in response to one or more magnetic fields impinging on the sensor element. Thus, a sensor signal is indicative of the magnitude and/or the orientation of the magnetic field impinging on the sensor element.

It will be appreciated that the terms "sensor" and "sensing element" may be used interchangeably throughout this description, and the terms "sensor signal" and "measurement signal" may also be used interchangeably throughout this description.

As an example, one or more embodiments one or more magnetic sensors may be a Hall-effect sensor (i.e., a Hall sensor), but is not limited thereto.

A Hall effect sensor is a transducer that varies its output voltage (Hall voltage) in response to a magnetic field. It is based on the Hall effect which makes use of the Lorentz force. The Lorentz force deflects moving charges in the presence of a magnetic field which is perpendicular to the current flow through the sensor or Hall plate. Thereby a Hall plate can be a thin piece of semiconductor or metal. The deflection causes a charge separation which causes a Hall electrical field. This electrical field acts on the charge in the opposite direction with regard to the Lorentz Force. Both forces balance each other and create a potential difference perpendicular to the direction of current flow. The potential difference can be measured as a Hall voltage and varies in a linear relationship with the magnetic field for small values. Hall effect sensors can be used for proximity switching, positioning, speed detection, and current sensing applications.

In some examples, Hall sensor elements may be implemented as a vertical Hall sensor elements. A vertical Hall sensor is a magnetic field sensor which is sensitive to a magnetic field component which extends parallel to their surface. This means they are sensitive to magnetic fields parallel, or in-plane, to the IC surface. The plane of sensitivity may be referred to herein as a "sensitivity-axis" or "sensing axis" and each sensing axis has a reference direction. For Hall sensor elements, voltage values output by the sensor elements change according to the magnetic field strength in the direction of the sensing axis.

In other examples, Hall sensor elements may be implemented as lateral Hall sensor elements. A lateral Hall sensor is sensitive to a magnetic field component perpendicular to their surface. This means they are sensitive to magnetic fields vertical, or out-of-plane, to the integrated circuit (IC) surface. The plane of sensitivity may be referred to herein as a "sensitivity-axis" or "sensing axis" and each sensing axis has a reference direction. For Hall sensor elements, voltage values output by the sensor elements change according to the magnetic field strength in the direction of the sensing axis.

The magnetic field sensor system, as provided herein, may be used as a current sensor. For example, the magnetic field sensor system can be used as a current sensor if it is coupled to a magnetic field generated by some current to be measured which flows through some primary conductor. For example, contactless current measurement can be accomplished by using the magnetic field sensor system to sense the magnetic field caused by a current passing through the primary conductor (further referred to as primary current). The magnetic field caused by the primary current depends on the magnitude of the primary current. For example, for a long straight wire carrying a primary current iP the magnitude of the resulting magnetic field H at a distance d from the wire is directly proportional to the primary current iP. In accordance to the Biot-Savart law, the magnitude of the magnetic field H equals $H=iP/(2nd)$ if the wire is very long (theoretically infinitely long) as compared to the distance d.

According to one or more embodiments, a magnetic field sensor and a sensor circuit may be both accommodated (i.e., integrated) in the same chip package (e.g., a plastic encapsulated package, such as leaded package or leadless package, or a surface mounted device (SMD)-package). This chip package may also be referred to as sensor package. The sensor package may be combined with a back bias magnet to form a sensor module, sensor device, or the like.

The sensor circuit may be referred to as a signal processing circuit and/or a signal conditioning circuit that receives one or more signals (i.e., sensor signals) from one or more magnetic field sensor elements in the form of raw measurement data and derives, from the sensor signal, a measurement signal that represents the magnetic field. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a sensor output suitable for processing after conditioning.

Thus, the sensor circuit may include an analog-to-digital converter (ADC) that converts the analog signal from the one or more sensor elements to a digital signal. The sensor circuit may also include a digital signal processor (DSP) that performs some processing on the digital signal. Therefore, the sensor package may include a circuit that conditions and amplifies the small signal of the magnetic field sensor element via signal processing and/or conditioning.

A sensor device, as used herein, may refer to a device which includes a sensor and sensor circuit as described above. A sensor device may be integrated on a single semiconductor die (e.g., silicon die or chip), although, in other embodiments, a plurality of dies may be used for implementing a sensor device. Thus, the sensor and the sensor circuit are disposed on either the same semiconductor die or on multiple dies in the same package. For example, the sensor might be on one die and the sensor circuit on another die such that they are electrically connected to each other within the package. In this case, the dies may be comprised of the same or different semiconductor materials, such as GaAs and Si, or the sensor might be sputtered to a ceramic or glass platelet, which is not a semiconductor.

According to one or more embodiments, a sensor package, which includes at least one magnetic field sensor element (e.g., a Hall sensor element) is placed in proximity to the primary conductor. The one or more magnetic field sensor elements (or magnetic field sensors) included in the sensor package is thus exposed to the magnetic field caused by the primary current, and a sensor signal (usually a voltage signal) provided by the magnetic field sensor element is proportional to the magnitude of the magnetic field and thus also proportional to the primary current. Thus, an on-chip magnetic sensor is provided to measure the magnetic field generated by the primary current.

In particular, the embodiments are directed to a combination of a power module and magnetic sensors implemented as a current sensor. The current sensor may be an in-phase current sensor. The power module may include a single inverter or n inverters, hence have one phase or n phases, respectively. The power module may be a high current power module with a signal inverter that includes one current output to drive a load. In an example for implementing n inverters, the power module may be a high current power module that includes three current outputs (i.e., n=3) used to drive each of three phases of an electric motor. For example, the power module may be used for driving a main motor of an electric car. Thus, the current sensor may include three current sensors arranged, for example, as a current sensing module that is configured to measure each current output of the power module.

FIG. 1 is a schematic block diagram illustrating a motor control loop 100 of a power module according to one or more embodiments. In particular, the motor control loop 100 includes a power module 1, a current sensor module 2, and an inverter control board 3. The motor control loop 100 is further coupled to a three-phase motor 10, that includes three phases U, V, and W. The power module 1 is a three-phase current generator configured to provide three-phase power by supplying three phase currents to drive the motor 10.

Three-phase power involves three symmetrical sine waves that are 120 electrical degrees out of phase with one another. For example, in a symmetric three-phase power supply system, three conductors each carry an alternating current of the same frequency and voltage amplitude relative to a common reference but with a phase difference of one third the period. The common reference is usually connected to ground and often to a current-carrying conductor called the neutral. Due to the phase difference, the voltage on any conductor reaches its peak at one third of a cycle after one of the other conductors and one third of a cycle before the remaining conductor. This phase delay gives constant power transfer to a balanced linear load. It also makes it possible to produce a rotating magnetic field in an electric motor and generate other phase arrangements using transformers.

In a three-phase system feeding a balanced and linear load, the sum of the instantaneous currents of the three conductors is zero. In other words, the current in each conductor is equal in magnitude to the sum of the currents in the other two, but with the opposite sign. The return path for the current in any phase conductor is the other two phase conductors.

Deviations in both magnitude and phase may case a loss in power and torque in the motor. Therefore, the motor control loop 100 is configured to monitor and control the magnitude and phase of the currents supplied to the motor 10 to ensure the proper current balance is maintained.

The power module 1 is coupled to a power supply (e.g., a battery) and is configured to regulate and supply a current to an output current rail for each phase of the motor 10. Thus, the power module 1 includes three output current rails. The power module 1 itself may include a separate driver circuit for each output, where each driver circuit is configured to generate an output current that is provided to a corresponding current rail. Thus, the power module 1 may include three driver circuits.

For the purpose of illustration, each current rail is represented as a current path 4*u*, 4*v*, and 4*w*, and each current path 4*u*, 4*v*, and 4*w* is coupled between an output of the power module 1 and a corresponding phase of the motor 10.

The current sensor module 2 is coupled to the current paths 4*u*, 4*v*, and 4*w*. In particular, the current sensor module 2 includes three magnetic sensors 5*u*, 5*v*, and 5*w*, each disposed in a corresponding current path 4*u*, 4*v*, and 4*w*. As will be described in more detail below, each magnetic sensor 5*u*, 5*v*, and 5*w* is incorporated in an opening (e.g., a hole or a slot) formed in each current rail and is configured to measure a current flowing through the corresponding current rail. Specifically, each magnetic sensor 5*u*, 5*v*, and 5*w* may include a differential Hall sensor pair configured to generate a differential sensor signal, to be described below. It will be appreciated by a person of ordinary skill that the current sensor may be implemented such that the differential sensor signal is calculated within the sensor and an output signal is provided over a single terminal. When referring to a differential sensor signal such implementation of the sensor shall be covered as well by the term “differential sensor signal”.

Each current flowing through the current rails in an output direction (i.e., from the power module towards a load) generates a magnetic field that can be measured by a magnetic sensor. The magnetic fields caused by the currents are directly proportional to the magnitude of each corresponding current. In particular, the measured magnetic field represents (i.e., is proportional to) a current density of a current flowing through a current rail.

Thus, each magnetic sensor 5*u*, 5*v*, and 5*w* is configured to generate a sensor signal (e.g., a differential sensor signal) in response to a magnetic field impinging thereon, which is representative of the current density of a current passing through the corresponding current rail. Each magnetic sensor is configured to provide a sensor signal to the inverter control board 3. Since each sensor signal is representative of a current, each sensor signal is labeled as Iu, Iv, and Iw, even if the sensor signal is actually a voltage value generated, for example, by a Hall sensor.

The inverter control board 3 is configured to receive each sensor signal provided by the magnetic sensors 5*u*, 5*v*, and 5*w*, and control the power module 1 based on each measurement value of the sensor signals. That is, the inverter control board 3 provides control to the power module 1 based on the measurement value of the sensor signals, and the power module 1 regulates the currents based on the feedback. Thus, the motor control loop 100 may be configured to maintain the proper current balance supplied to the motor 10.

Figure 2A:
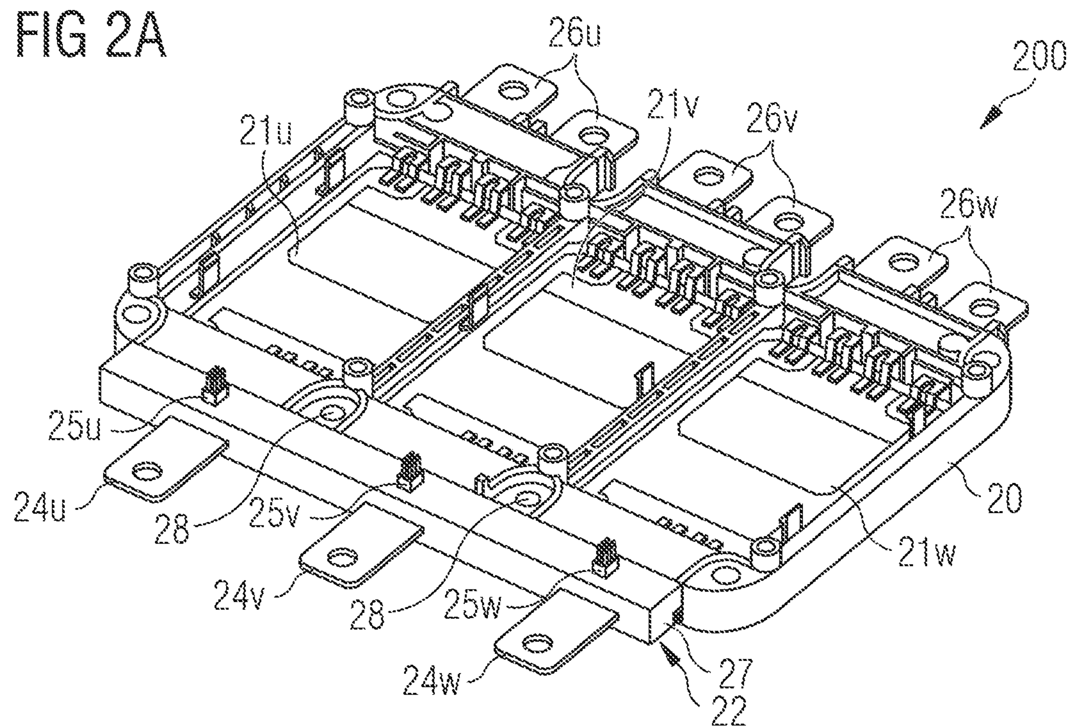
FIGS. 2A-2C illustrate a power module according to one or more embodiments.

FIG. 2A illustrates a perspective view of a power module 200 according to one or more embodiments. The power module 200 may be a high current power module configured to drive an electric motor, as described above. In particular, the power module 200 may be a three-phase current generator configured to provide three-phase power by supplying three phase currents to drive a motor. The power module 200 includes a housing 20 made of plastic or other insulator molding material. Therefore, the housing 20 is a structure that houses components of the power module 200.

Input leads 26*u*, 26*v*, and 26*w* that extend from the housing 20 are configured to be connected to a power supply, such as a battery, to provide power to the power module 200. On the other side of the power module 200, output leads 24*u*, 24*v*, and 24*w* extend from the housing 20 and are configured to be connected to separate phases of the motor. Specifically, the output leads 24*u*, 24*v*, and 24*w* have been previously referred to as current rails, and may also be referred to as busbars. Input leads 26*u*, 26*v*, and 26*w* and the output leads 24*u*, 24*v*, and 24*w* may be made of copper or other electrically conductive material.

Inside the housing 20, driver boards 21*u*, 21*v*, and 21*w* are provided for each phase of the motor. The driver boards 21*u*, 21*v*, and 21*w* each include circuitry that is configured to generate a current supplied to each phase of the motor via current rails 24*u*, 24*v*, and 24*w*, respectively. Thus, the current rails 24*u*, 24*v*, and 24*w* are connected, at a first end, to a respective output of the power module 200 (i.e., a respective driver board 21*u*, 21*v*, or 21*w*), and are configured to be connected, at a second end opposite to the first end, to a respective input (phase) of the motor.

In addition, a current sensor module 22 is provided at the current rails 24*u*, 24*v*, and 24*w*. Specifically, the current sensor module 22 may be provided onto a top-side or onto bottom-side of the current rails 24*u*, 24*v*, and 24*w*. For example, the current sensor module may include an insulator body structure 27 configured to at least partially house magnetic Hall sensors 25*u*, 25*v*, and 25*w*. The insulator body structure 27 may be disposed on a top-side or on a bottom-side of the current rails 24*u*, 24*v*, and 24*w*.

Alternatively, insulator body structure 27 may include a first portion disposed on the top-side of the current rails 24*u*, 24*v*, and 24*w*, and may include a second portion disposed on the bottom-side of the current rails 24*u*, 24*v*, and 24*w* such that the first portion and the second portion encase the current rails 24*u*, 24*v*, and 24*w*. For example, the first portion and the second portion of the insulator body structure 27 may be arranged in contact with each other when they are assembled via coupling to the housing 20 and/or a coupling to each other. By doing so, the first portion and the second portion of the insulator body structure 27, together, may encapsulate a portion of each current rail 24*u*, 24*v*, and 24*w*.

When the first portion and the second portion are used, the first portion may include an opening that extends vertically therethrough, and the second portion may include an opening that extend partially therethrough in the vertical direction. Together, the opening of the first portion, the opening of the current rail and the opening of the second portion may form a trench, and a magnetic sensor 25*u*, 25*v*, or 25*w* may be inserted through the openings until it reaches the bottom of the trench. It will also be appreciated that this arrangement may be reversed.

The insulator body structure 27 may also include fastening holes 28 at its perimeter, where the fastening holes 28 are configured to receive a fastener (not shown) for fixedly coupling the insulator body structure 27 to the housing 20 of the power module 200.

Figure 2B:
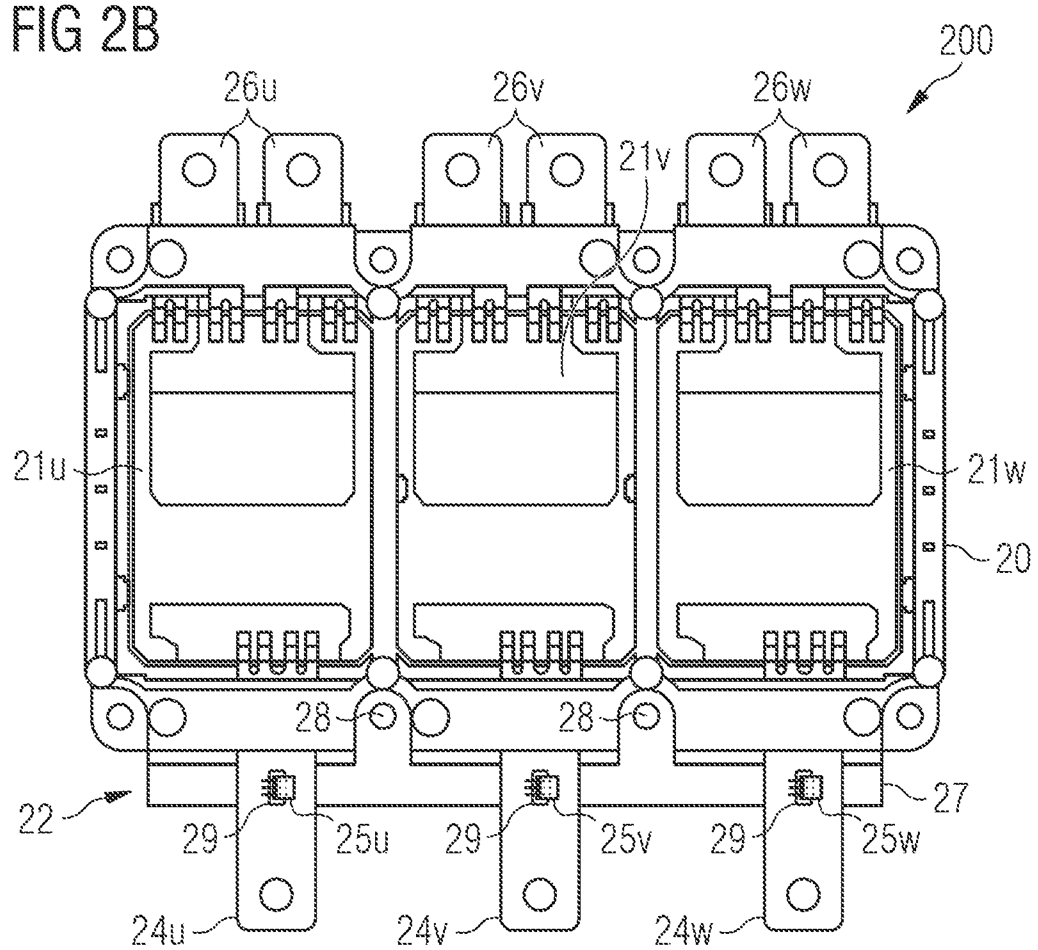

FIG. 2B illustrates a plan view of the power module 200 shown in FIG. 2A. In particular, the current sensor module 22 is shown as arranged at an bottom-side of the current rails 24*u*, 24*v*, and 24*w*, or with the first portion of the insulator body structure 27 removed in order to show the current rails 24*u*, 24*v*, and 24*w*. Here, it can be seen that each current rail 24*u*, 24*v*, and 24*w* includes an opening 29 (e.g., a hole or a slot) that extends through a respective current rail 24*u*, 24*v*, and 24*w*. Each opening 29 is configured to receive and host a respective magnetic Hall sensor 25*u*, 25*v*, or 25*w* therein.

Each current rail 24*u*, 24*v*, and 24*w* includes an opening 29 in which a magnetic sensor 25*u*, 25*v*, or 25*w* is in incorporated therein. Each magnetic sensor 25*u*, 25*v*, or 25*w* may include a sensor IC and a differential Hall sensor pair that are differentially placed at different locations on a sensor die. As will be shown, the differential Hall sensor pair are two Hall sensor elements that are differentially spaced in a vertical direction with respect to a center thickness of the respective current rail 24*u*, 24*v*, and 24*w*.

Together, the differential Hall sensor pair generates an analog differential sensor signal (e.g., a differential Hall voltage). In general, the differential sensor signal is derived from the two sensor signals generated by the sensor elements of the differential Hall sensor pair using differential calculus. As an example, the differential Hall sensor elements may be coupled to combining circuitry or combining logic configured to generate the differential sensor signal. Thus, the combining circuitry of the sensor circuit may receive sensor signals from the Hall sensor elements and may generate a differential sensor signal therefrom. For example, the combining circuitry of may include one or more differential amplifiers that outputs the difference between the Hall sensor elements. A differential sensor signal may provide robustness to homogenous and non-homogenous external stray magnetic fields, and may provide more accurate measurements compared to a monocell sensor configuration.

Figure 2C:
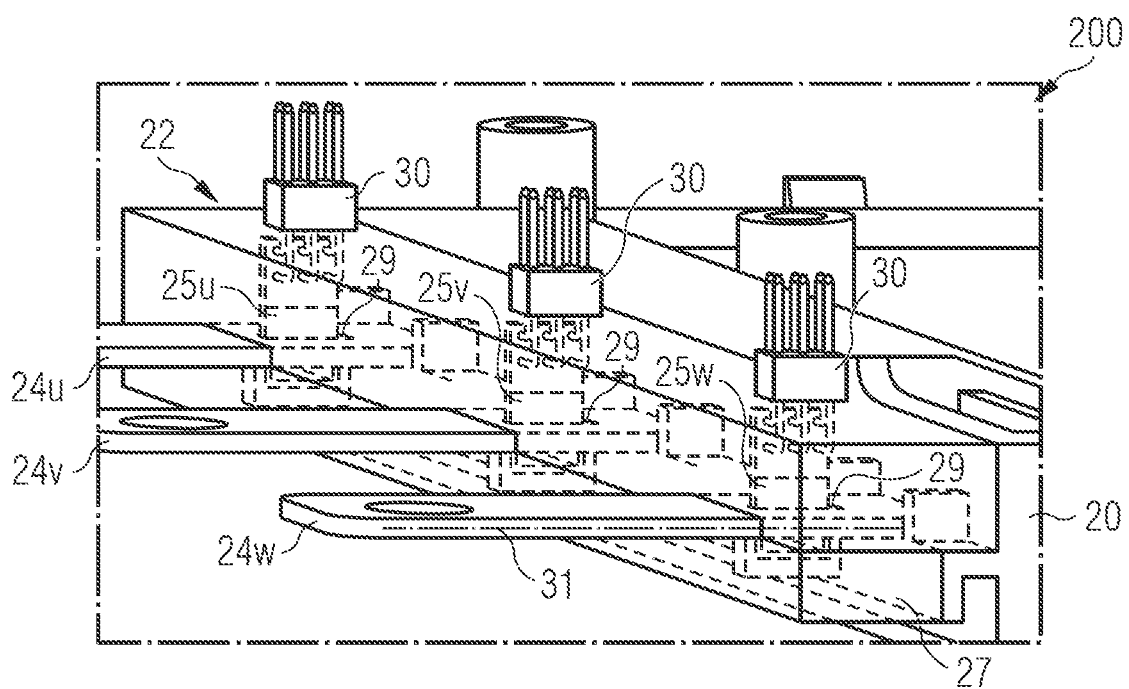

FIG. 2C illustrates another perspective view of the power module 200 shown in FIGS. 2A and 2B. In particular, FIG. 2C shows the magnetic sensors 25*u*, 25*v*, and 25*w* inserted through an opening 29 of a respective current rail 24*u*, 24*v*, and 24*w*, where part of each magnetic sensor 25*u*, 25*v*, and 25*w* is arranged above and below a middle region of the respective current rail 24*u*, 24*v*, and 24*w*. Thus, the two differential Hall sensor elements of each magnetic sensor 25*u*, 25*v*, and 25*w* may be differentially spaced with respect to a center thickness of the respective current rail 24*u*, 24*v*, and 24*w*. For illustrative purposes, a dotted line is shown indicating a longitudinal axis 31 extending along in a center of the current rail 24*w*.

In addition, a connector 30 is provided for each magnetic sensor 25*u*, 25*v*, and 25*w*. Each connector 30 may be disposed external to the insulator body structure 27 and may be coupled to one of the magnetic sensors 25*u*, 25*v*, and 25*w*, to provide an electrical connection to the power module 200 (e.g., to the inverter circuit board 3). Thus, sensor signals (e.g., differential sensor signals) from the magnetic sensors 25*u*, 25*v*, and 25*w* may be transmitted to the power module 200 via the connectors 30.

Figure 3A:
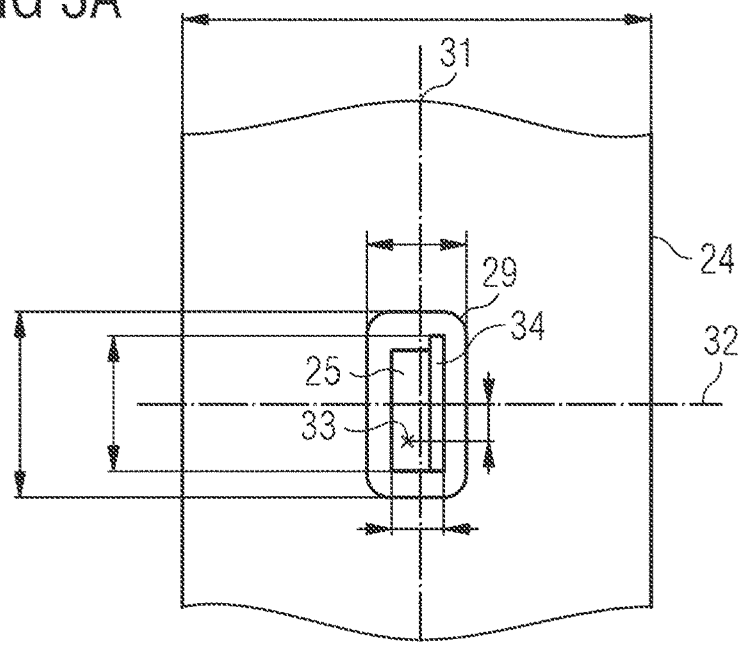
FIGS. 3A-3C show an open-loop, core-less magnetic sensor integrated in a current rail according to one or more embodiments.
Figure 3B:
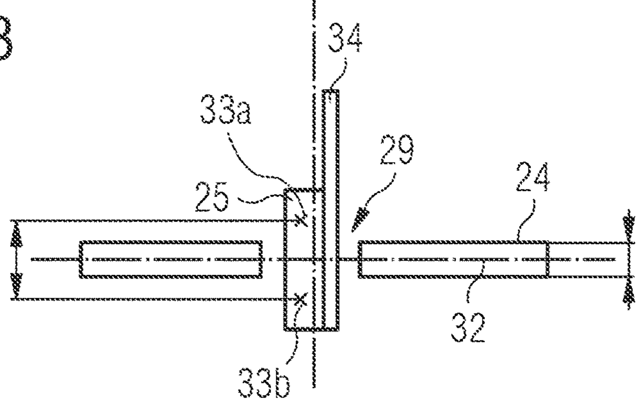
Figure 3C:
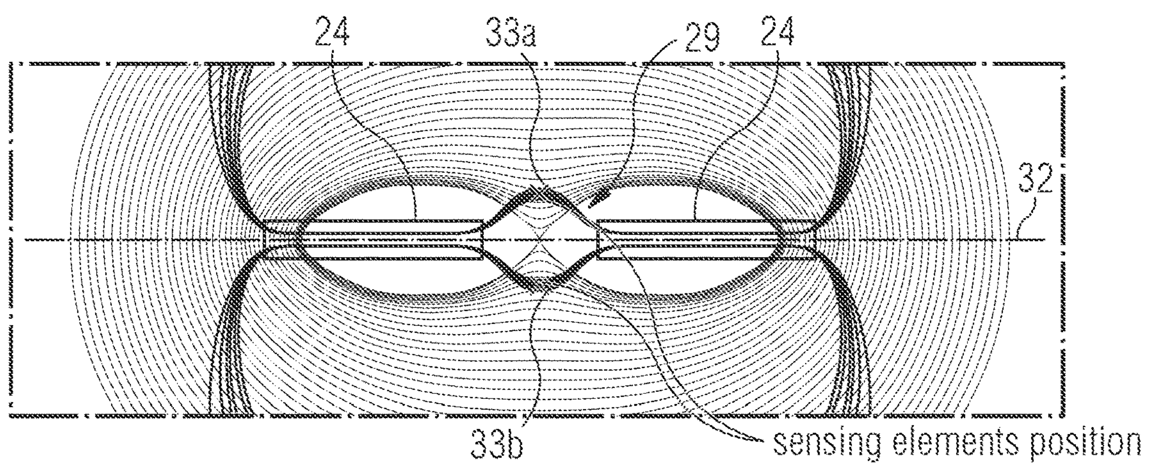

FIGS. 3A-3C show an open-loop, core-less magnetic sensor integrated in a current rail (i.e., a busbar) according to one or more embodiments. In particular, FIG. 3A shows a plan view of a current rail 24 that includes an open-loop, core-less magnetic sensor 25 integrated within an opening 29 formed in the current rail 24. The opening 29 may be centered about a longitudinal axis 31 as well as a transverse axis 32 of the current rail 24. In other words, the magnetic sensor 25 may be substantially centered within a section of the current rail 24, or substantially centered within in the current path of the current rail. As used herein, the longitudinal axis 31 and the transverse axis 32 represent a longitudinal direction and a transverse direction of the current rail 24, respectively. The thickness of the current rail 24 represents a vertical direction of the current rail 24.

As noted above, the magnetic sensor 25 may include two differentially spaced sensing elements 33, one of which is shown in FIG. 3A, whereas the other one is hidden behind the shown sensing element 33. The magnetic sensor 25 is further shown to be coupled to a printed circuit board 34. However, the embodiments are not limited thereto, and the magnetic sensor 25 may alternatively be provided in a leaded package.

FIG. 3B shows a cross-sectional view of the open-loop, core-less magnetic sensor integrated in a current rail shown in FIG. 3A. Here, it can be seen that the magnetic sensor 25 includes two Hall sensing elements 33*a* and 33*b*, equally spaced from a center axis (e.g., the transverse axis 32) of the current rail 24. That is, the sensing elements 33*a* and 33*b* are symmetrical about a center of the current rail 24, offset to the same extent in the thickness (i.e., the vertical) direction from the center thickness of the current rail 24. recuse Alternatively, the sensor elements 33*a*, 33*b* may be offset non-symmetrically from the centered position of the current rail 24 and yet the magnetic sensor 25 would be operable. As a trade-off, a signal strength detected by the magnetic sensor 25 may be reduced.

FIG. 3C also shows a cross-sectional view of the open-loop, core-less magnetic sensor integrated in a current rail shown in FIG. 3A, but additionally includes a shape (i.e., a pattern) of the magnetic field generated by the current flowing through the current rail 24 with the opening 29. A high current density of a current flowing through the current rail 24 produces a corresponding high magnetic field density.

The transverse axis 32 extends along a vertical center of the current rail 24, from which the sensing elements 33*a* and 33*b* are equally spaced. Based on the differential position of the sensing elements 33*a* and 33*b*, it can be seen that the magnetic field impinges upon both sensing elements 33*a* and 33*b* with equal magnitude. The sensing elements 33*a* and 33*b* should be arranged such that they are located inside the magnetic field. To increase the likelihood of this phenomenon, the sensing elements 33*a* and 33*b* may be substantially centered within the opening 29, and spaced apart from each other. However, it will be appreciated that other arrangements are possible so long as the sensing elements are located within the magnetic field or at a location where the magnetic field is expected when a current is applied through the current rail. Thus, the sensor elements 33*a*, 33*b* may be non-symmetrically offset from the centered position.

The sensing principle of the Hall sensing elements 33*a* and 33*b* and arrangement of the current sensor module 22 will now be described in more detail. As shown in FIG. 3C, the sensing elements 33*a* and 33*b* may be configured to sense a perpendicular magnetic field of the current rail 24. The sensing elements 33*a* and 33*b* are arranged as differential sensing elements, which together, generate a differential sensor signal through differential calculus based on a magnetic field impinging on each sensing element. In particular, each sensing element generates a sensor signal that is output to a sensor circuit that, in turn, generates an analog differential sensor signal using the sensor signals received from each sensing element. These sensor signals may also be referred as measurement signals that represent a measured value of the magnetic field.

The differential sensor signal represents a differential magnetic field between the two sensing positions. Measuring the differential magnetic field also allows a sensor 25 to be robust against homogenous and non-homogenous stray fields that may influence a measurement that may lead to incorrect measurements.

Accordingly, the two Hall sensing elements 33*a* and 33*b* may be arranged in a sensor package that is disposed in the opening 29 of a current rail 24. The sensing axis of each sensing element 33*a* and 33*b* may be aligned in parallel with each other such that a same magnetic field component (e.g., an x-component) of the magnetic field is measured.

As shown in FIGS. 2A-2C, each opening 29 may be arranged in proximity to the power module 200, which may, for example, reduce the size (i.e., the footprint) of the device.

Further, the current sensor module 22 may include an insulator body structure 27 (e.g., plastic) that includes three openings similarly arranged with respect to the openings 29 of the current rails 24*u*, 24*v*, and 24*w*. At least a portion of each magnetic sensor 25*u*, 25*v*, and 25*w* may be incorporated within a respective opening formed in the insulator body structure 27, while a remaining portion of each magnetic sensor 25*u*, 25*v*, and 25*w* is incorporated in the opening 29 of a current rail 24*u*, 24*v*, or 24*w*. When viewed in a vertical direction, the sensing elements 33*a* and 33*b* may thus be provided in proximity to, but outside of, opening 29 but located within a corresponding opening of the insulator body structure 27. A depth of the sensing elements 33*a* and 33*b* and the vertical spacing thereof may be set relative to a center axis of a current rail 24, where the center axis extends along a vertical center of the current rail 24. The center axis may be a longitudinal axis 31 or a transverse axis 32, as described above.

For assembly purposes, the three holes of the current sensor module 22 may be aligned with the holes 29 formed in the current rails 24*u*, 24*v*, or 24*w*. Thus, when the current sensor module 27 is arranged at a surface of the current rails 24*u*, 24*v*, or 24*w* (e.g., from either a top side, a bottom side, or a top side and a bottom side of the current rails), the respective sensing elements 33*a* and 33*b* are provided in a differential sensing configuration in proximity to a respective current rail 24*u*, 24*v*, or 24*w*. The insulator body structure 27 may also include fastening holes 28 at its perimeter, where the fastening holes are configured to receive a fastener for fixedly coupling the current sensor module 22 to the power module 200. The insulator body structure 27 insulates the magnetic sensors 25*u*, 25*v*, and 25*w* from the high power density of the power module 200.

In another assembly process, the current sensor module 22 may be mounted to the power module 200, and, subsequent to mounting, the magnetic sensors 25*u*, 25*v*, and 25*w* may be inserted into the openings of both the current sensor module 22 and the current rails 24*u*, 24*v*, and 24*w* to their final position.

Thus, by integrating a discrete current sensor module 22 in the manner described above, a current sensing principle (e.g., an in-phase current sensing principle) may be utilized to monitor and regulate the output current for each phase of an electric motor. Furthermore, by providing the magnetic sensors 25*u*, 25*v*, and 25*w* in an output structure of a power module in the described manner, the magnetic sensors 25*u*, 25*v*, and 25*w* may allow assembly to be simplified and the footprint of the overall device to be reduced. In addition, since there is no iron core, as in core-based solutions, the changes in the magnetic field detected by the coreless magnetic sensor occur in a linear manner. This may further lead to more accurate measurements and a simplification of the sensor circuitry.

Figure 4:
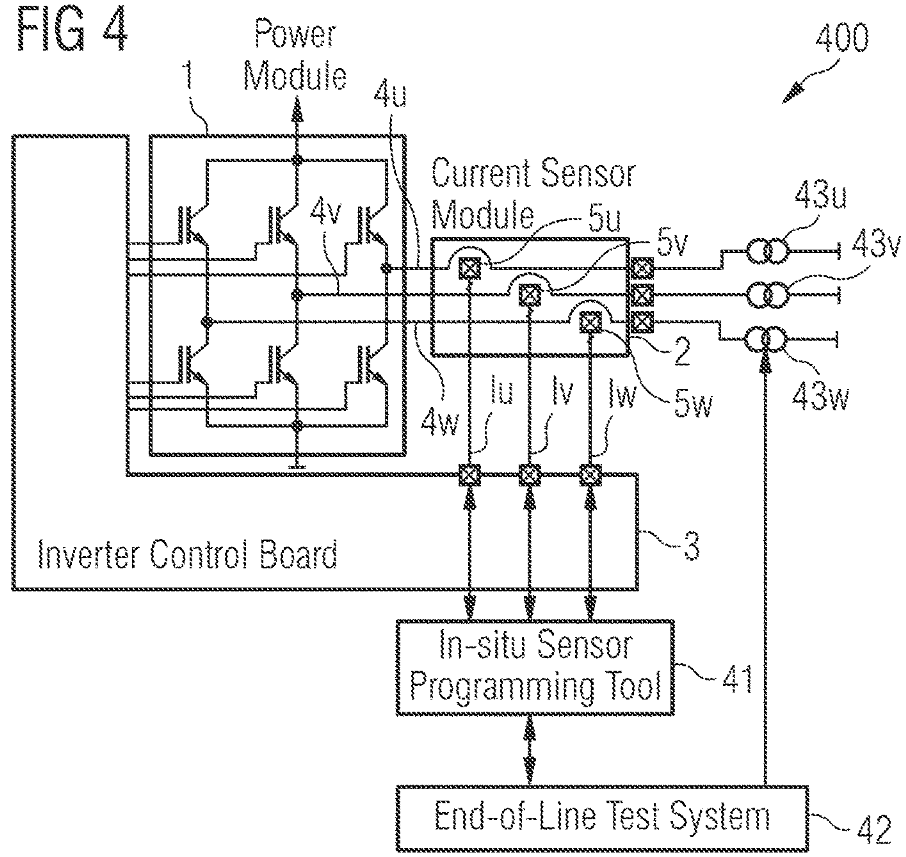
FIG. 4 shows a schematic block diagram of an end-of-line (EOL) calibration setup for a three-phase system according to one or more embodiments.

In addition, end-of-line (EOL) current calibration may be used to increase the accuracy of the current sensor module and to cancel out additional errors due to mechanical positioning tolerances. The additional errors may result in temperature and lifetime accuracy errors. FIG. 4 shows a schematic block diagram of an EOL calibration setup for a three-phase system according to one or more embodiments. As similarly presented in FIG. 1, the EOL calibration setup includes a power module 1, a current sensor module 2, and a inverter control board 3. In addition, the EOL calibration setup includes an in-situ sensor programming tool 41 and an EOL test system 42.

The in-situ sensor programming tool 41 is configured to receive the sensor signals from the magnetic sensors 5*u*, 5*v*, and 5*w* in order to initialize the EOL test system 42. The EOL test system is further configured to program a test current that is input into the current sensor module 2. For example, with a 3 point EOL calibration procedure, three test currents are applied (e.g., $-I_{FSR}$, 0, and $+I_{FSR}$) with external sources 43*u*, 43*v*, and 43*w*. The test currents are set by the EOL test system 42 such that a current flows through each current path 4*u*, 4*v*, and 4*w*. The applied currents are measured by magnetic sensors 5*u*, 5*v*, and 5*w*, and compensation factors are determined by the EOL test system 42 and stored in a controller or in each magnetic sensor 5*u*, 5*v*, and 5*w*. Thus, one or more initial errors that may be present at the current sensor module 2 may be eliminated.

Figure 5:
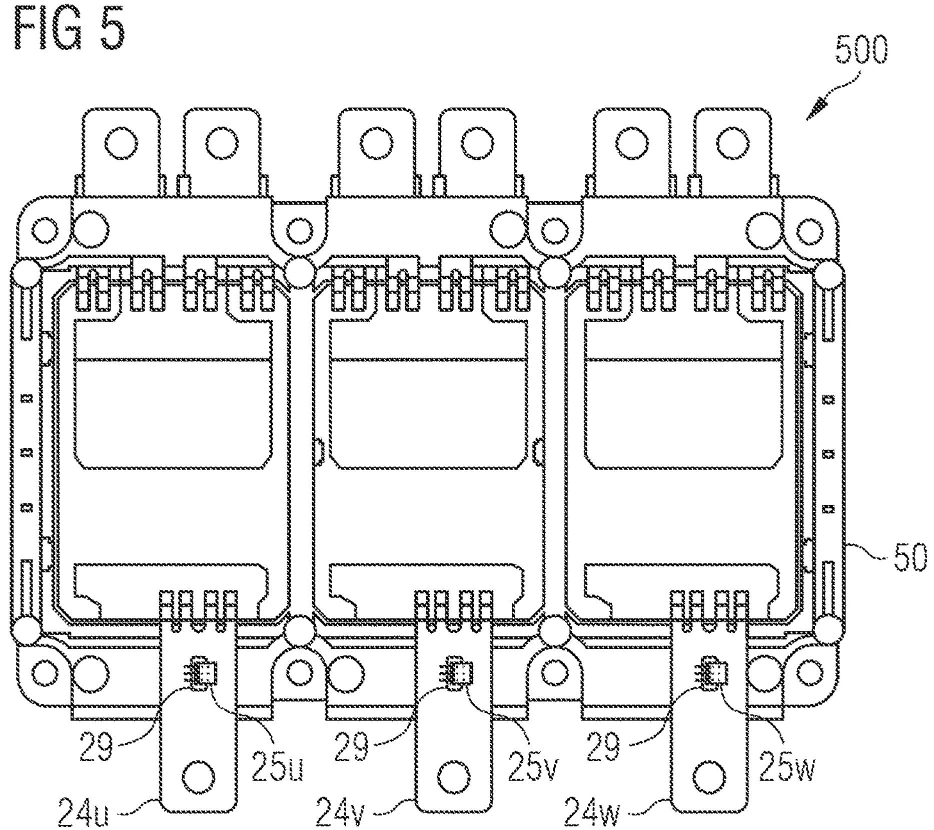
FIG. 5 shows a plan view of a power module according to another embodiment.

FIG. 5 shows a plan view of a power module according to another embodiment. In particular, power module 500 is similar to power module 200 shown in FIGS. 2A-2C, except the magnetic sensors 25*u*, 25*v*, and 25*w* are integrated or mounted into recess provided in the housing 20 of the power module 500. As described above with reference to FIGS. 2A-2C, the housing 20 is a frame body made of insulating material (e.g., molding or plastic) that houses components of the power module 500.

Thus, each current rail 24*u*, 24*v*, and 24*w* includes an opening 29 that is aligned with a recess provided in the housing 20 of the power module 500. In particular, each recess is located at a periphery of the power module 500 (i.e., at a periphery of the housing 20) and located to coincide with an opening 29 of a respective current rail 24*u*, 24*v*, and 24*w*. The magnetic sensors 25*u*, 25*v*, and 25*w* may be is inserted through a respective opening 29 of a current rail 24*u*, 24*v*, and 24*w* such that at least a portion of the magnetic sensor 25*u*, 25*v*, and 25*w* extends into a respective recess of the housing 20. Each recess may be configured such that the sensing elements of each magnetic sensor 25*u*, 25*v*, and 25*w* are differentially spaced with respect to a center of a current rail 24*u*, 24*v*, and 24*w*, in a similar manner described above. As a result of additional space not being needed to accommodate an insulator body structure 27, the current rails 24*u*, 24*v*, and 24*w* can be shortened as compared to the current rails shown in FIGS. 2A-2C. In addition, a fully calibrated system of power module and current sensing may be provided without the need for an EOL calibration process.

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure. Such hardware, software, and firmware may be implemented within the same device or within separate devices to support the various techniques described in this disclosure.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A power module configured to supply power to a load, comprising:

a current generator configured to generate a current;

a current rail configured to receive the current and output the current from the power module, wherein the current rail includes a first opening formed therethrough, and the current, while flowing along the current rail in an output direction, flows around the first opening; and a housing that houses the current generator, wherein the housing comprises an outer frame from which the current rail outwardly extends, wherein the outer frame includes a recess aligned with the first opening of the current rail such that the recess and the first opening form a unitary opening.

2. The power module of claim 1, wherein the outer frame is made of insulating material.

3. The power module of claim 2, wherein the outer frame defines a periphery of the housing.

4. The power module of claim 1, wherein the first opening and the recess are configured to receive a magnetic sensor for measuring the current flowing along the current rail in the output direction.

5. The power module of claim 4, wherein the current, while flowing along the current rail in the output direction, produces a magnetic field in the first opening representative of the current flowing along the current rail in the output direction.

6. The power module of claim 5, wherein the magnetic field is produced in a location that is detectable by the magnetic sensor.

7. The power module of claim 1, wherein the first opening is formed through the current rail and is substantially centered in a current path of the current rail.

8. A power module configured to supply power to a load, comprising:

a current generator configured to generate a current;

a current rail configured to receive the current and output the current from the power module, wherein the current rail includes a first opening formed therethrough, and the current, while flowing along the current rail in an output direction, flows around the first opening;

a housing that houses the current generator, wherein the housing comprises an outer frame from which the current rail outwardly extends; and an insulator body structure coupled to the outer frame, wherein the insulator body structure includes a second opening formed at least partially therethrough, the second opening being aligned with the first opening of the current rail such that the first and the second openings form a unitary opening.

9. The power module of claim 8, wherein the current rail outwardly extends through the insulator body structure.

10. The power module of claim 8, wherein the insulator body structure is disposed in contact with a surface of the current rail.

11. The power module of claim 10, wherein the second opening extends fully through the insulator body structure.

12. The power module of claim 8, wherein the insulator body structure comprises a first portion disposed on a first surface of the current rail and a second portion disposed on a second surface of the current rail such that the first and the second portions of the insulator body structure encapsulate a portion of the current rail.

13. The power module of claim 12, wherein the first and the second portions of the insulator body structure are in contact with each other.

14. The power module of claim 12, wherein:

the first portion of the insulator body structure includes the second opening that extends fully therethrough, and the second portion of the insulator body structure includes a third opening that extends at least partially therethrough, wherein the third opening is aligned with the first opening of the current rail and the second opening of the first portion of the insulator body structure such that the first, the second, and the third openings form the unitary opening.

15. The power module of claim 14, wherein the unitary opening is configured to receive a magnetic sensor for measuring the current flowing along the current rail in the output direction.

16. The power module of claim 8, wherein the unitary opening is configured to receive a magnetic sensor for measuring the current flowing along the current rail in the output direction.

17. The power module of claim 8, wherein the insulator body structure comprises fastening holes each configured to receive a fastener for fixedly coupling the insulator body structure to the outer frame.

18. A power module configured to supply power to a load, comprising:

a current generator configured to generate a plurality of phase currents;

a plurality of current rails each configured to receive a respective phase current of the plurality of phase currents and output the respective phase current from the power module, wherein each of the plurality of current rails includes a first opening formed therethrough, and the plurality of phase currents, while flowing along a respective current rail of the plurality of current rails in an output direction, flow around a respective first opening;

a housing that houses the current generator, wherein the housing comprises an outer frame from which the plurality of current rails outwardly extend; and an insulator body structure including a plurality of second openings formed at least partially therethrough, each of the plurality of second openings being aligned with the first opening of the respective current rail to form a unitary opening.

19. A power module configured to supply power to a load, comprising:

a current generator configured to generate a plurality of phase currents;

a plurality of current rails each configured to receive a respective phase current of the plurality of phase currents and output the respective phase current from the power module, wherein each of the plurality of current rails includes a first opening formed therethrough, and the plurality of phase currents, while flowing along a respective current rail of the plurality of current rails in an output direction, flow around a respective first opening; and a housing that houses the current generator, wherein the housing comprises an outer frame from which the plurality of current rails outwardly extend, wherein the outer frame includes a plurality of recesses each respectively aligned with the first opening of a different one of the plurality of current rails to form a unitary opening for each current rail.

* * * * *